(12) United States Patent
Liu

(10) Patent No.: US 11,316,127 B2
(45) Date of Patent: Apr. 26, 2022

(54) ORGANIC LIGHT EMITTING DISPLAY DEVICE AND METHOD OF FABRICATING SAME

(71) Applicant: SHENZHEN CHINA STAR OPTOELECTRONICS SEMICONDUCTOR DISPLAY TECHNOLOGY CO., LTD., Shenzhen (CN)

(72) Inventor: Ming Liu, Shenzhen (CN)

(*) Notice: Subject to any disclaimer, the term of this patent is extended or adjusted under 35 U.S.C. 154(b) by 274 days.

(21) Appl. No.: 16/618,120

(22) PCT Filed: Aug. 6, 2019

(86) PCT No.: PCT/CN2019/099372
§ 371 (c)(1),
(2) Date: Nov. 28, 2019

(87) PCT Pub. No.: WO2021/012314
PCT Pub. Date: Jan. 28, 2021

(65) Prior Publication Data
US 2021/0336188 A1  Oct. 28, 2021

(30) Foreign Application Priority Data
Jul. 23, 2019 (CN) .......................... 201910665543.8

(51) Int. Cl.
*H01L 51/52* (2006.01)
*H01L 51/56* (2006.01)
*H01L 27/32* (2006.01)

(52) U.S. Cl.
CPC .......... *H01L 51/5228* (2013.01); *H01L 51/56* (2013.01); *H01L 27/3246* (2013.01); *H01L 27/3283* (2013.01); *H01L 2251/5369* (2013.01)

(58) Field of Classification Search
None
See application file for complete search history.

(56) References Cited

U.S. PATENT DOCUMENTS 9,076,977 B2 * 7/2015 Sonoda ................ H01L 51/001
2016/0218160 A1   7/2016 Yamazaki et al.
2021/0104585 A1 * 4/2021 Gao .................... H01L 51/5228

FOREIGN PATENT DOCUMENTS

| CN | 101805538 A | 8/2010 |
| CN | 102827509 A | 12/2012 |
| CN | 107808897 A | 3/2018 |
| JP | 2009009821 A | 1/2009 |

* cited by examiner

*Primary Examiner* — Michelle Mandala

(57) ABSTRACT

An organic light emitting display device and a method of fabricating the same are provided. The organic light emitting display device includes a substrate, a pixel defining layer, an organic functional layer, a wire mesh structure, a cathode, and a protective layer. The pixel defining layer is disposed on the substrate and includes a plurality of pixel defining units. The organic functional layer is disposed on the anode of the substrate and in a space between any two adjacent pixel defining units. The cathode is disposed on the organic functional layer and in contact with the wire mesh structure.

16 Claims, 3 Drawing Sheets

ORGANIC LIGHT EMITTING DISPLAY DEVICE AND METHOD OF FABRICATING SAME

FIELD OF INVENTION

The present disclosure relates to the field of display technologies, and more particularly to an organic light emitting display device and a method of fabricating the same.

BACKGROUND OF INVENTION

Current top-emitting organic light emitting display devices each require a top electrode (cathode) having a certain high transparency. If metal such as magnesium-silver alloy is used as the top electrode, a thickness of the top electrode needs to be controlled to be less than 20 nm. In the case of such a thin metal, a cross-sectional current is greatly limited and exhibits poor conductivity. When such a cathode is applied to a large-sized display panel, a voltage drop (internal resistance (IR) drop) of different regions of the display panel varies depending on a distance of a supply circuit, causing a display area of the display panel to be uneven.

In another prior art, in current top-emitting organic light emitting display devices, in a panel region, an auxiliary electrode is additionally added in addition to a pixel region. Both the auxiliary electrode and a bottom electrode of the pixel region are covered by an organic material during vapor deposition of the organic material, so that a subsequent vapor-deposited top electrode is difficult to form effective contact with the auxiliary electrode.

Therefore, there is a need to provide an organic light emitting display device and a method of fabricating the same to solve issues of the prior art.

SUMMARY OF INVENTION

In order to solve the above technical problems, an object of the present disclosure is to provide an organic light emitting display device and a method of fabricating the same that can improve conductivity of a cathode by contacting the cathode with a wire mesh structure.

To achieve the above object, an embodiment of the present disclosure provides an organic light emitting display device. The organic light emitting display device includes a substrate, a pixel defining layer, an organic functional layer, a wire mesh structure, a cathode, and a protective layer. The substrate includes an anode. The pixel defining layer is disposed on the substrate and includes a plurality of pixel defining units. Any two adjacent pixel defining units include a space defined therebetween. The organic functional layer is disposed on the anode and positioned in the space between any two adjacent pixel defining units. The wire mesh structure is disposed on the pixel defining layer. The cathode is disposed on the organic functional layer and in contact with the wire mesh structure. The protective layer is disposed on the cathode and disposed opposite to the substrate. The wire mesh structure includes an ink layer and a plurality of silver nanoparticles disposed in the ink layer. Each of the silver nanoparticles has a particle size ranging between 15 nm and 25 nm. The ink layer includes a solvent and a solute, the solute includes the silver nanoparticles, and a mass percentage of the solute ranges between 50% and 80%.

In an embodiment of the present disclosure, the solvent includes any one of ethylene glycol, butanol, isopropanol, isobutanol, and ethylene glycol diethyl ether or a mixture thereof.

In an embodiment of the present disclosure, a wire of the wire mesh structure has a width ranging between 2 um and 5 um, and the wire mesh structure is disposed on upper edge of the pixel defining layer, and a width of the upper edge of a cross section of the pixel defining layer is greater than or equal to 8 um.

In an embodiment of the present disclosure, the organic functional layer includes a hole injection layer, a hole transport layer, a light emitting layer, an electron transport layer, and an electron injection layer which are sequentially arranged, the anode is connected to hole injection layer, and the electron injection layer is connected to the cathode.

An embodiment of the present disclosure further provides an organic light emitting display device. The organic light emitting display device includes a substrate, a pixel defining layer, an organic functional layer, a wire mesh structure, a cathode, and a protective layer. The substrate includes an anode. The pixel defining layer is disposed on the substrate and includes a plurality of pixel defining units. Any two adjacent pixel defining units include a space defined therebetween. The organic functional layer is disposed on the anode and positioned in the space between any two adjacent pixel defining units. The wire mesh structure is disposed on the pixel defining layer. The cathode is disposed on the organic functional layer and in contact with the wire mesh structure. The protective layer is disposed on the cathode and disposed opposite to the substrate.

In an embodiment of the present disclosure, the wire mesh structure includes an ink layer and a plurality of silver nanoparticles disposed in the ink layer.

In an embodiment of the present disclosure, each of the silver nanoparticles has a particle size ranging between 15 nm and 25 nm.

In an embodiment of the present disclosure, the ink layer includes a solvent and a solute, the solute includes the silver nanoparticles, and a mass percentage of the solute ranges between 50% and 80%.

In an embodiment of the present disclosure, the solvent includes any one of ethylene glycol, butanol, isopropanol, isobutanol, and ethylene glycol diethyl ether or a mixture thereof.

In an embodiment of the present disclosure, a wire of the wire mesh structure has a width ranging between 2 um and 5 um, and the wire mesh structure is disposed on upper edge of the pixel defining layer, and a width of the upper edge of a cross section of the pixel defining layer is greater than or equal to 8 um.

In an embodiment of the present disclosure, the organic functional layer includes a hole injection layer, a hole transport layer, a light emitting layer, an electron transport layer, and an electron injection layer which are sequentially arranged, the anode is connected to hole injection layer, and the electron injection layer is connected to the cathode.

An embodiment of the present disclosure further provides a method of fabricating an organic light emitting display device including providing a substrate including an anode, forming a pixel defining layer on the substrate, wherein the pixel defining layer includes a plurality of pixel defining units, and any two adjacent pixel defining units include a space defined therebetween, forming an organic functional layer on the anode, wherein the organic functional layer is positioned in the space between any two adjacent pixel defining units, forming a wire mesh structure on the pixel defining layer, forming a cathode on the organic functional layer, wherein the cathode is in contact with the wire mesh structure, and forming a protective layer on the cathode, wherein the protective layer is disposed opposite to the substrate.

In an embodiment of the present disclosure, the wire mesh structure is formed by printing an ink layer comprising a plurality of silver nanoparticles on the pixel defining layer and heating the ink layer.

In an embodiment of the present disclosure, each of the silver nanoparticles has a particle size ranging between 15 nm and 25 nm.

In an embodiment of the present disclosure, the ink layer includes a solvent and a solute, the solute includes the silver nanoparticles, and a mass percentage of the solute ranges between 50% and 80%.

In an embodiment of the present disclosure, the solvent includes any one of ethylene glycol, butanol, isopropanol, isobutanol, and ethylene glycol diethyl ether or a mixture thereof.

In an embodiment of the present disclosure, a wire of the wire mesh structure has a width ranging between 2 um and 5 um, and the wire mesh structure is disposed on upper edge of the pixel defining layer, and a width of the upper edge of a cross section of the pixel defining layer is greater than or equal to 8 um.

In an embodiment of the present disclosure, the organic functional layer includes a hole injection layer, a hole transport layer, a light emitting layer, an electron transport layer, and an electron injection layer which are sequentially arranged, the anode is connected to hole injection layer, and the electron injection layer is connected to the cathode.

Compared with the prior art, in order to solve the above technical problem, in the organic light emitting display device and the method of fabricating the same in the embodiments of the present disclosure, the organic light emitting display device includes a substrate, a pixel defining layer, an organic functional layer, a wire mesh structure, a cathode, and a protective layer. The wire mesh structure is disposed on the pixel defining layer, and the cathode is disposed on the organic functional layer and in contact with the wire mesh structure to improve conductivity of the cathode.

DETAILED DESCRIPTION OF PREFERRED EMBODIMENTS

Figure 1:
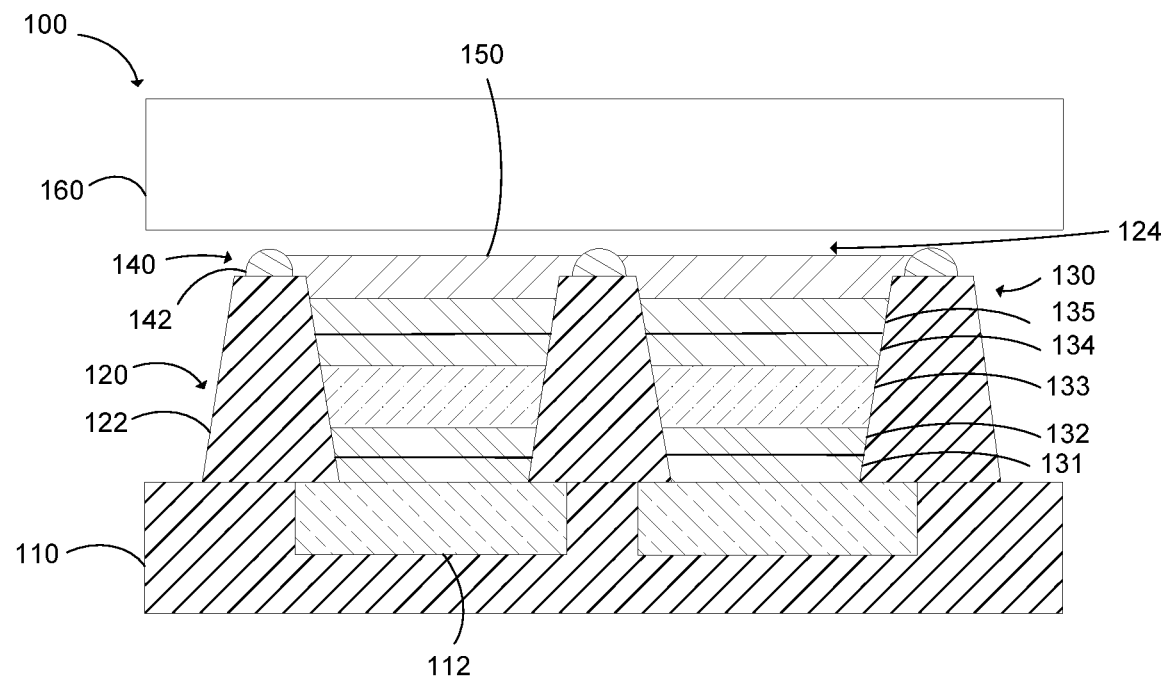
FIG. 1 is a schematic structural view of an organic light emitting display device according to an embodiment of the present disclosure.

The following description of the various embodiments is provided to illustrate the specific embodiments with reference to the accompanying drawings.

In order to make the above description of the present disclosure and other objects, features, and advantages of the present disclosure more comprehensible, preferred embodiments are described below, and are described in detail below with reference to the accompanying drawings. Furthermore, directional terms described by the present disclosure, such as up, down, top, bottom, front, back, left, right, inner, outer, side, surrounding, center, horizontal, vertical, longitudinal, axial, radial, uppermost or lowermost, etc., are only directions by referring to the accompanying drawings, and thus the used terms are used only for the purpose of describing embodiments of the present disclosure and are not intended to be limiting of the present disclosure.

In the drawings, units with similar structures are labeled with the same reference number.

Referring to FIG. 1, an embodiment of the present disclosure provides an organic light emitting display device 100. The organic light emitting display device 100 includes a substrate 110, a pixel defining layer 120, an organic functional layer 130, a wire mesh structure 140, a cathode 150, and a protective layer 160. The substrate 110 includes an anode 112. The pixel defining layer 120 is disposed on the substrate 110 and includes a plurality of pixel defining units 122. A space 124 is defined between any two adjacent pixel defining units 122. The organic functional layer 130 is disposed on the anode 112 and within the space 124 between any two adjacent pixel defining units 122. The wire mesh structure 140 is disposed on the pixel defining layer 122. The cathode 150 is disposed on the organic functional layer 130 and in contact with the wire mesh structure 140. The protective layer 160 is disposed on the cathode 150 and disposed opposite to the substrate 110. Embodiments of the present disclosure are capable of increasing conductivity of the cathode 150 by contacting the cathode 150 with the wire mesh structure 140.

Figure 2:
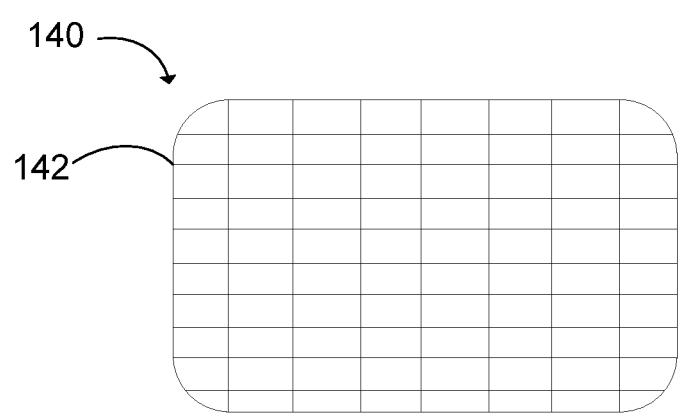
FIG. 2 is a schematic structural view of a wire mesh structure according to an embodiment of the present disclosure.

Referring to FIG. 1 and FIG. 2, in an embodiment of the present disclosure, the wire mesh structure 140 includes an ink layer 142 and a plurality of silver nanoparticles disposed in the ink layer 142. In an embodiment of the present disclosure, each of the silver nanoparticles has a particle size ranging between 15 nm and 25 nm. The ink layer 142 includes a solvent and a solute, the solute includes the silver nanoparticles, and a mass percentage of the solute ranges between 50% and 80%, for example 75%. In an embodiment of the present disclosure, the solvent includes any one of ethylene glycol, butanol, isopropanol, isobutanol, and ethylene glycol diethyl ether or a mixture thereof. In an embodiment of the present disclosure, a wire of the wire mesh structure 140 has a width ranging between 2 um and 5 um, and the wire mesh structure 140 is disposed on upper edge of the pixel defining layer 120, and a width of the upper edge of a cross section of the pixel defining layer 120 is greater than or equal to 8 um.

In an embodiment of the present disclosure, the organic functional layer 130 includes a hole injection layer 131, a hole transport layer 132, a light emitting layer 133, an electron transport layer 134, and an electron injection layer 135 which are sequentially arranged, the anode 112 is connected to hole injection layer 131, and the electron injection layer 135 is connected to the cathode 150.

Figure 3:
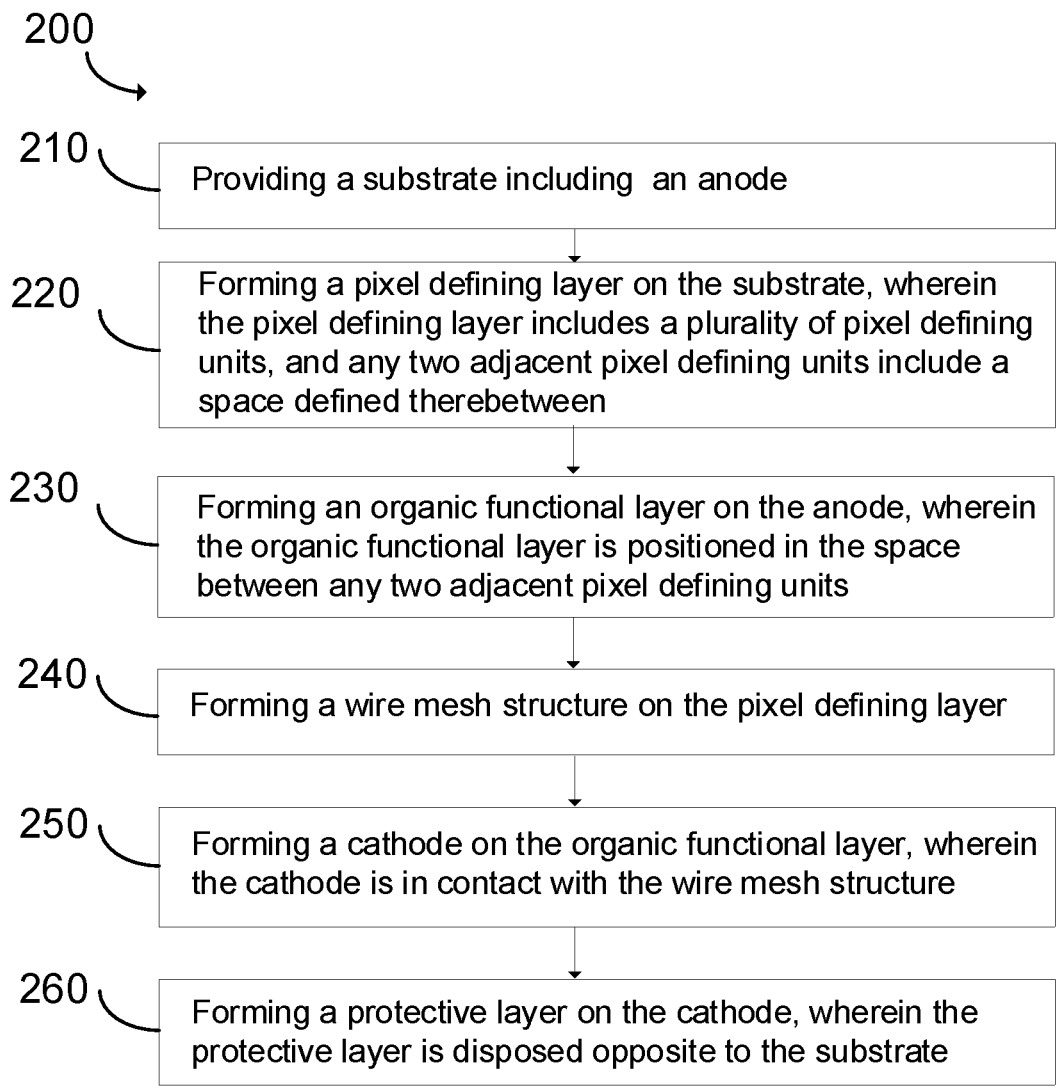
FIG. 3 is a block diagram illustrating a method of fabricating an organic light emitting display device according to an embodiment of the present disclosure.
Figure 4:
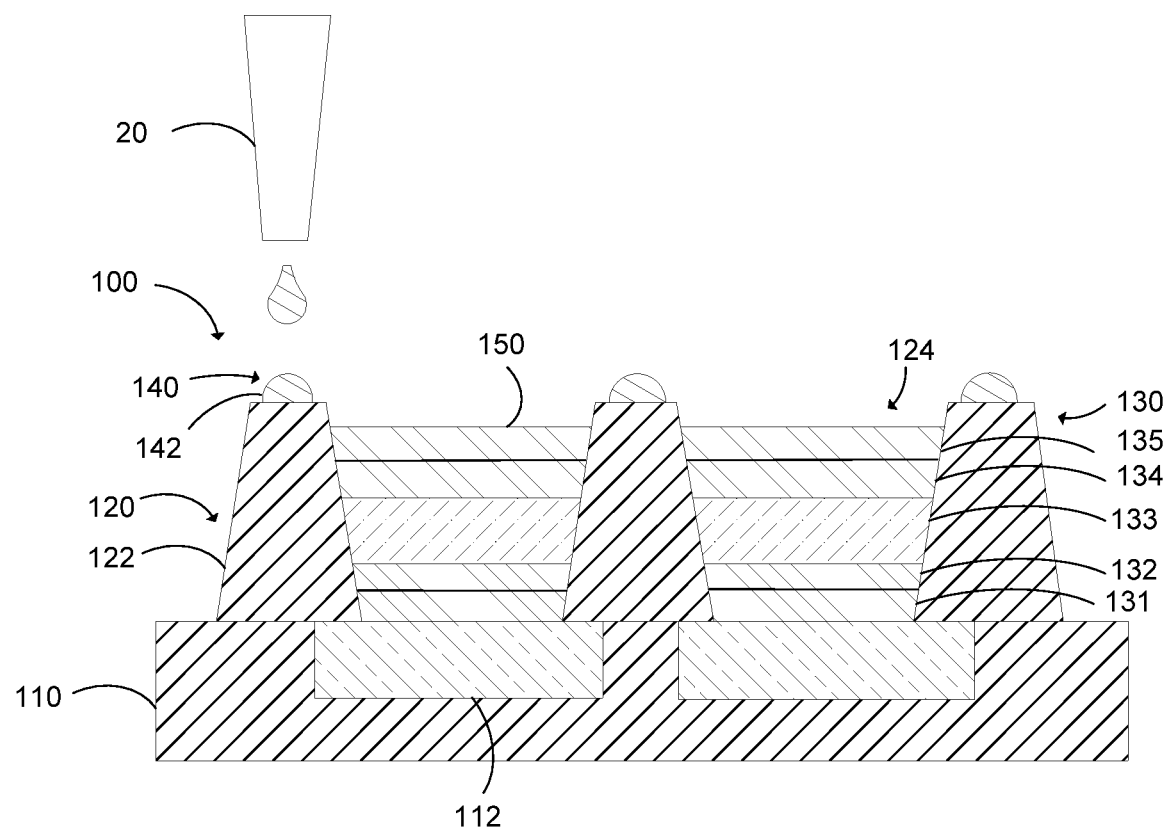
FIG. 4 is a schematic view of a method of fabricating an organic light emitting display device according to an embodiment of the present disclosure.

Referring to FIG. 3, an embodiment of the present disclosure further provides a method 200 of fabricating an organic light emitting display device. Referring to FIG. 1, FIG. 3, and FIG. 4, the method 200 of fabricating the organic light emitting display device 100 includes: a block 210, providing a substrate 110 including an anode 112, a block 220, forming a pixel definition layer 120 on the substrate 110, wherein the pixel defining layer 120 includes a plurality of pixel defining units 122, and any two adjacent pixel defining units 122 include a space 124 defined therebetween, a block 230, forming an organic functional layer 130 on the anode 112, wherein the organic functional layer 130 is positioned in the space 124 between any two adjacent pixel defining units 122, a block 240, forming a wire mesh structure 140 on the pixel defining layer 120, a block 250, forming a cathode 150 on the organic functional layer 130, wherein the cathode 150 is in contact with the wire mesh structure 140, and a block 260, forming a protective layer 160 on the cathode 150, wherein the protective layer 160 is disposed opposite to the substrate 110. Embodiments of the present disclosure are capable of increasing conductivity of the cathode 150 by contacting the cathode 150 with the wire mesh structure 140.

In an embodiment of the present disclosure, the wire mesh structure 140 includes an ink layer 142 and a plurality of silver nanoparticles disposed in the ink layer 142. In an embodiment of the present disclosure, each of the silver nanoparticles has a particle size ranging between 15 nm and 25 nm. The ink layer 142 includes a solvent and a solute, the solute includes the silver nanoparticles, and a mass percentage of the solute ranges between 50% and 80%, for example 75%. In an embodiment of the present disclosure, the solvent includes any one of ethylene glycol, butanol, isopropanol, isobutanol, and ethylene glycol diethyl ether or a mixture thereof. In an embodiment of the present disclosure, a wire of the wire mesh structure 140 has a width ranging between 2 um and 5 um, and the wire mesh structure 140 is disposed on upper edge of the pixel defining layer 120, and a width of the upper edge of a cross section of the pixel defining layer 120 is greater than or equal to 8 um.

In an embodiment of the present disclosure, the organic functional layer 130 includes a hole injection layer 131, a hole transport layer 132, a light emitting layer 133, an electron transport layer 134, and an electron injection layer 135 which are sequentially arranged, the anode 112 is connected to hole injection layer 131, and the electron injection layer 135 is connected to the cathode 150.

In an embodiment of the present disclosure, the wire mesh structure 140 is formed by printing an ink layer 142 including a plurality of silver nanoparticles on the pixel defining layer 120 and heating the ink layer 142.

In an embodiment of the present disclosure, the wire mesh structure 140 can be used to solve issues of regional non-uniformity of the display performance of a large-size top emission organic light emitting diode (OLED) display panel. In the process of preparing the organic light emitting display device 100, after the hole injection layer 131, the hole transport layer 132, the light emitting layer 133, the electron transport layer 134, and the electron injection layer 135 are sequentially evaporated, the wire mesh structure 140 is prepared, and the cathode 150 (top electrode) is evaporated, and then the protective layer 160 is prepared. In one embodiment of the present disclosure, the order of preparation of the wire mesh structure 140 and the cathode 150 (the top electrode) is interchangeable. The wire mesh structure 140 is located on the pixel defining layer 120 and covers the entire panel area of the organic light emitting display device 100. The wire mesh structure 140 is connected to a power source of the organic light emitting display device 100 on an outer edge of the panel of the organic light emitting display device 100.

In one embodiment of the present disclosure, the wire mesh structure 140 on the pixel defining layer 120 is easy to process, has good stability, is bendable (applicable on a flexible panel), and has high electrical conductivity. The top-emitting OLED panel using this method does not require additional preparation of auxiliary electrodes, which simplifies the manufacturing process and also substantially increases the total aperture ratio of the display pixels.

In one embodiment of the present disclosure, the wire mesh structure 140 is formed by printing the ink layer 142 including silver nanoparticles on the pixel defining layer 120 and heating the ink layer 142. The solute of the ink layer 142 includes the silver nanoparticles having a particle size ranging between 15 nm and 25 nm, and the concentration ranges between 50% and 80%, for example, 75% (mass %). The solvent includes any one of ethylene glycol, butanol, isopropanol, isobutanol, and ethylene glycol diethyl ether or a mixture thereof (but not limited thereto). A glass capillary having an opening diameter ranging between 1 um and 5 um is used as a print head 20. After printing the ink layer 142, the ink layer 142 can be baked at 150 degrees Celsius for 1 hour as a whole, and a silver wire of the ink layer 142 can also be directly sintered by using a micro-area laser technique (the temperature is about 200 degrees Celsius). The width of the silver wire of the ink layer 142 after molding ranges between 2 um and 5 um. The wire mesh structure 140 is disposed on upper edge of the pixel defining layer 120, and a width of the upper edge of a cross section of the pixel defining layer 120 is greater than or equal to 8 um.

The evaporation of the cathode 150 (the top electrode) is then completed, and the wire mesh structure 140 is in contact with the cathode 150 (the top electrode) to increase the conductivity of the cathode 150 (the top electrode).

In the organic light emitting display device and the method of fabricating the same in the embodiments of the present disclosure, the organic light emitting display device includes a substrate, a pixel defining layer, an organic functional layer, a wire mesh structure, a cathode, and a protective layer. The wire mesh structure is disposed on the pixel defining layer, and the cathode is disposed on the organic functional layer and in contact with the wire mesh structure to improve conductivity of the cathode.

In the organic light emitting display device and the method of fabricating the same in the embodiments of the present disclosure, the organic light emitting display device includes a substrate, a pixel defining layer, an organic functional layer, a wire mesh structure, a cathode, and a protective layer. The wire mesh structure is disposed on the pixel defining layer, and the cathode is disposed on the organic functional layer and in contact with the wire mesh structure to improve conductivity of the cathode.

Although the present disclosure is described via one or more embodiments, those of ordinary skill in the art can come up with equivalent variations and modifications based upon the understanding of the specification and the accompanying drawings. The present disclosure includes all such modifications and variations, and is only limited by the scope of the appended claims. In particular, as to the various functions performed by the components described above, the terms used to describe the components are intended to correspond to any component performing the specific functions (e.g., which are functionally equivalent) of the components (unless otherwise indicated), even those which are structurally different from the disclosed structure for performing the functions in the exemplary embodiments in the specification shown herein. In addition, although a particular feature in the specification is disclosed in only one of many embodiments, this feature may be combined with one or more features in other embodiments which are desirable and advantageous to a given or particular application. Moreover, the terms "include", "have", "consist of", or variations thereof used in the detailed description or the claims are intended to be used in a manner similar to the term "comprising".

In summary, although the preferable embodiments of the present disclosure have been disclosed above. It should be noted that those of ordinary skill in the art can make a variety of improvements and substitutions on the premise of not deviating from the technical principle of the present disclosure, and these improvements and substitutions should be encompassed within the protection scope of the present disclosure.

What is claimed is:

1. An organic light emitting display device, comprising:
a substrate comprising an anode;
a pixel defining layer disposed on the substrate and comprising a plurality of pixel defining units, wherein any two adjacent pixel defining units comprise a space defined therebetween;
an organic functional layer disposed on the anode and positioned in the space between any two adjacent pixel defining units;
a wire mesh structure disposed on the pixel defining layer;
a cathode disposed on the organic functional layer and in contact with the wire mesh structure; and
a protective layer disposed on the cathode and disposed opposite to the substrate;
wherein the wire mesh structure comprises an ink layer and a plurality of silver nanoparticles disposed in the ink layer;
wherein each of the silver nanoparticles has a particle size ranging between 15 nm and 25 nm; and
wherein the ink layer comprises a solvent and a solute, the solute comprises the silver nanoparticles, and a mass percentage of the solute ranges between 50% wt % and 80% wt %.

2. The organic light emitting display device according to claim 1, wherein the solvent comprises any one of ethylene glycol, butanol, isopropanol, isobutanol, and ethylene glycol diethyl ether or a mixture thereof.

3. The organic light emitting display device according to claim 1, wherein a wire of the wire mesh structure has a width ranging between 2 um and 5 um, and the wire mesh structure is disposed on upper edge of the pixel defining layer, and a width of the upper edge of a cross section of the pixel defining layer is greater than or equal to 8 um.

4. The organic light emitting display device according to claim 1, wherein the organic functional layer comprises a hole injection layer, a hole transport layer, a light emitting layer, an electron transport layer, and an electron injection layer which are sequentially arranged, the anode is connected to hole injection layer, and the electron injection layer is connected to the cathode.

5. An organic light emitting display device, comprising:
a substrate comprising an anode;
a pixel defining layer disposed on the substrate and comprising a plurality of pixel defining units, wherein any two adjacent pixel defining units comprise a space defined therebetween;
an organic functional layer disposed on the anode and positioned in the space between any two adjacent pixel defining units;
a wire mesh structure disposed on the pixel defining layer;
a cathode disposed on the organic functional layer and in contact with the wire mesh structure; and
a protective layer disposed on the cathode and disposed opposite to the substrate;
wherein the wire mesh structure comprises an ink layer and a plurality of silver nanoparticles disposed in the ink layer.

6. The organic light emitting display device according to claim 5, wherein each of the silver nanoparticles has a particle size ranging between 15 nm and 25 nm.

7. The organic light emitting display device according to claim 5, wherein the ink layer comprises a solvent and a solute, the solute comprises the silver nanoparticles, and a mass percentage of the solute ranges between 50% wt % and 80% wt %.

8. The organic light emitting display device according to claim 7, wherein the solvent comprises any one of ethylene glycol, butanol, isopropanol, isobutanol, and ethylene glycol diethyl ether or a mixture thereof.

9. The organic light emitting display device according to claim 5, wherein a wire of the wire mesh structure has a width ranging between 2 um and 5 um, and the wire mesh structure is disposed on upper edge of the pixel defining layer, and a width of the upper edge of a cross section of the pixel defining layer is greater than or equal to 8 um.

10. The organic light emitting display device according to claim 5, wherein the organic functional layer comprises a hole injection layer, a hole transport layer, a light emitting layer, an electron transport layer, and an electron injection layer which are sequentially arranged, the anode is connected to hole injection layer, and the electron injection layer is connected to the cathode.

11. A method of fabricating an organic light emitting display device, comprising:
providing a substrate comprising an anode;
forming a pixel defining layer on the substrate, wherein the pixel defining layer comprises a plurality of pixel defining units, and any two adjacent pixel defining units comprise a space defined therebetween;
forming an organic functional layer on the anode, wherein the organic functional layer is positioned in the space between any two adjacent pixel defining units;
forming a wire mesh structure on the pixel defining layer;
forming a cathode on the organic functional layer, wherein the cathode is in contact with the wire mesh structure; and
forming a protective layer on the cathode, wherein the protective layer is disposed opposite to the substrate;
wherein the wire mesh structure is formed by printing an ink layer comprising a plurality of silver nanoparticles on the pixel defining layer and heating the ink layer.

12. The method according to claim 11, wherein each of the silver nanoparticles has a particle size ranging between 15 nm and 25 nm.

13. The method according to claim 11, wherein the ink layer comprises a solvent and a solute, the solute comprises the silver nanoparticles, and a mass percentage of the solute ranges between 50% wt % and 80% wt %.

14. The method according to claim 13, wherein the solvent comprises any one of ethylene glycol, butanol, isopropanol, isobutanol, and ethylene glycol diethyl ether or a mixture thereof.

15. The method according to claim 11, wherein a wire of the wire mesh structure has a width ranging between 2 um and 5 um, and the wire mesh structure is disposed on upper edge of the pixel defining layer, and a width of the upper edge of a cross section of the pixel defining layer is greater than or equal to 8 um.

16. The method according to claim 11, wherein the organic functional layer comprises a hole injection layer, a hole transport layer, a light emitting layer, an electron transport layer, and an electron injection layer which are sequentially arranged, the anode is connected to hole injection layer, and the electron injection layer is connected to the cathode.

* * * * *